(12) United States Patent
Kulick et al.

(10) Patent No.: US 9,806,030 B2
(45) Date of Patent: Oct. 31, 2017

(54) PROTOTYPING OF ELECTRONIC CIRCUITS WITH EDGE INTERCONNECTS

(71) Applicant: Indiana Integrated Circuits, LLC, South Bend, IN (US)

(72) Inventors: Jason M. Kulick, South Bend, IN (US); Tian Lu, Osceola, IN (US)

(73) Assignee: Indiana Integrated Circuits, LLC, South Bend, IN (US)

( * ) Notice: Subject to any disclaimer, the term of this patent is extended or adjusted under 35 U.S.C. 154(b) by 0 days.

(21) Appl. No.: 15/295,385

(22) Filed: Oct. 17, 2016

(65) Prior Publication Data

US 2017/0125350 A1    May 4, 2017

Related U.S. Application Data

(60) Provisional application No. 62/247,477, filed on Oct. 28, 2015, provisional application No. 62/247,457, filed on Oct. 28, 2015, provisional application No. 62/247,439, filed on Oct. 28, 2015.

(51) Int. Cl.
| | |
|---|---|
| *H01L 23/528* | (2006.01) |
| *H01L 23/538* | (2006.01) |
| *H01L 21/48* | (2006.01) |
| *H01L 21/52* | (2006.01) |

(52) U.S. Cl.
CPC ...... *H01L 23/5389* (2013.01); *H01L 21/4853* (2013.01); *H01L 21/52* (2013.01); *H01L 23/5382* (2013.01); *H01L 23/5386* (2013.01)

(58) Field of Classification Search
CPC ........ H01L 23/48; H01L 23/52; H01L 23/528
See application file for complete search history.

(56) References Cited

U.S. PATENT DOCUMENTS

| | | | |
|---|---|---|---|
| 7,612,443 B1 | 11/2009 | Bernstein et al. | |
| 2012/0228750 A1* | 9/2012 | Okumura | ............ H01L 21/6836 257/659 |
| 2013/0228915 A1* | 9/2013 | Chang | ................... H01L 21/568 257/734 |
| 2014/0057393 A1* | 2/2014 | Bonart | ..................... H01L 25/50 438/113 |
| 2014/0227834 A1* | 8/2014 | Karpman | ................. H01L 24/80 438/126 |
| 2016/0090298 A1* | 3/2016 | Sengupta | .............. B81B 7/0048 257/415 |

* cited by examiner

*Primary Examiner* — Jae Lee
(74) *Attorney, Agent, or Firm* — The Webb Law Firm

(57) ABSTRACT

In a method of forming an assembly including projecting or protruding nodules, a substrate is provided that supports an electrical circuit. One or more cavities are formed in the substrate, a conductive pad is formed in each cavity, and one or more conductive traces are formed on the substrate. Each conductive trace connects a conductive pad to a location, node, or terminal of the electrical circuit. A part of the substrate is removed to form the assembly that includes the electrical circuit, the one or more conductive traces, and a portion of each conductive pad projecting or protruding from the substrate. The electrical circuit can be formed on the substrate, which can be a PCB, or can be formed on a microchip supported by the substrate, which can be formed of semiconductor material, e.g., a semiconductor wafer.

13 Claims, 20 Drawing Sheets

EXAMPLE 1
STEP 20 (CONTINUED)

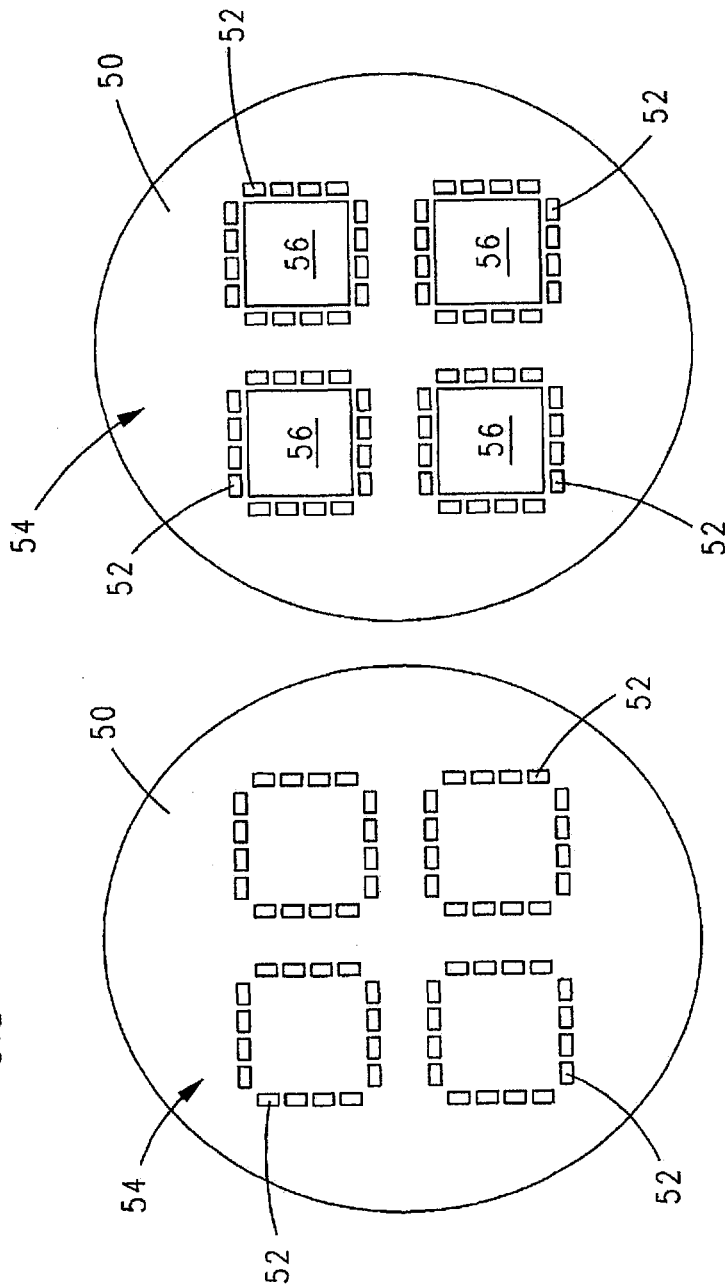

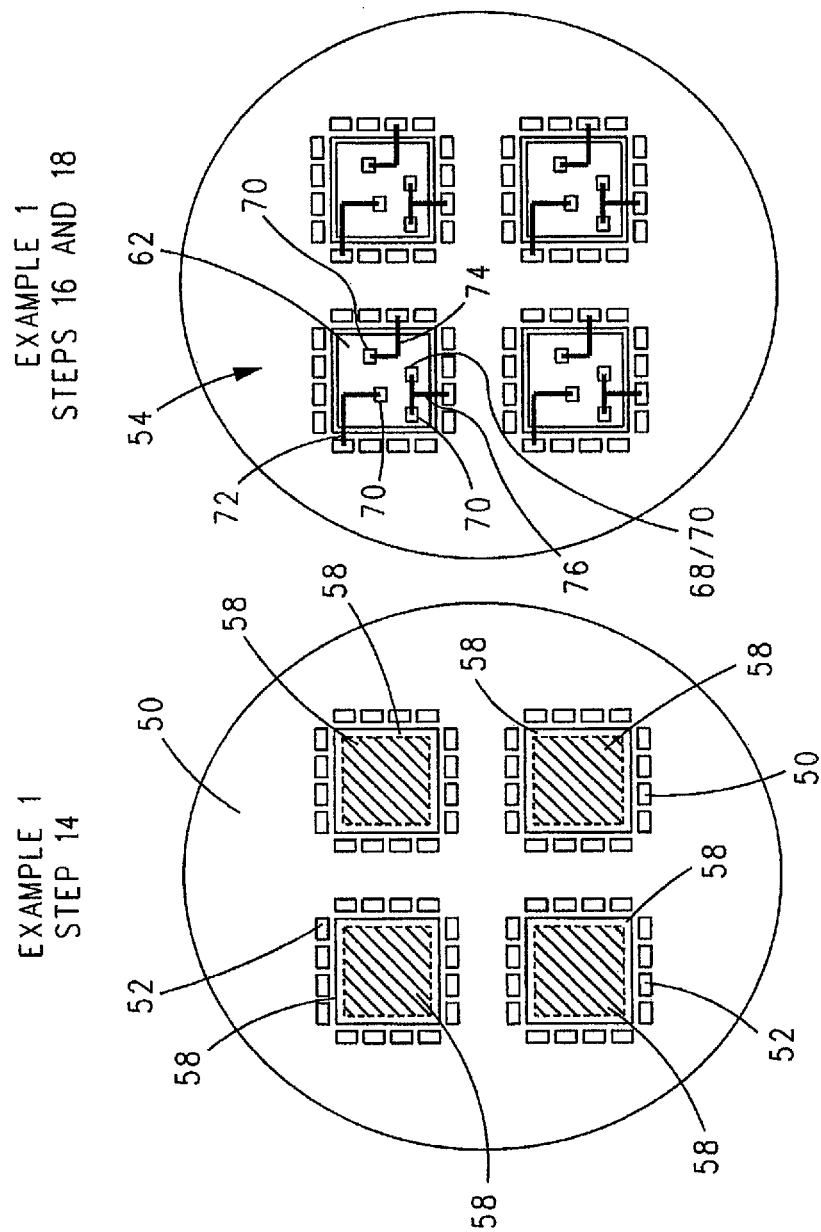

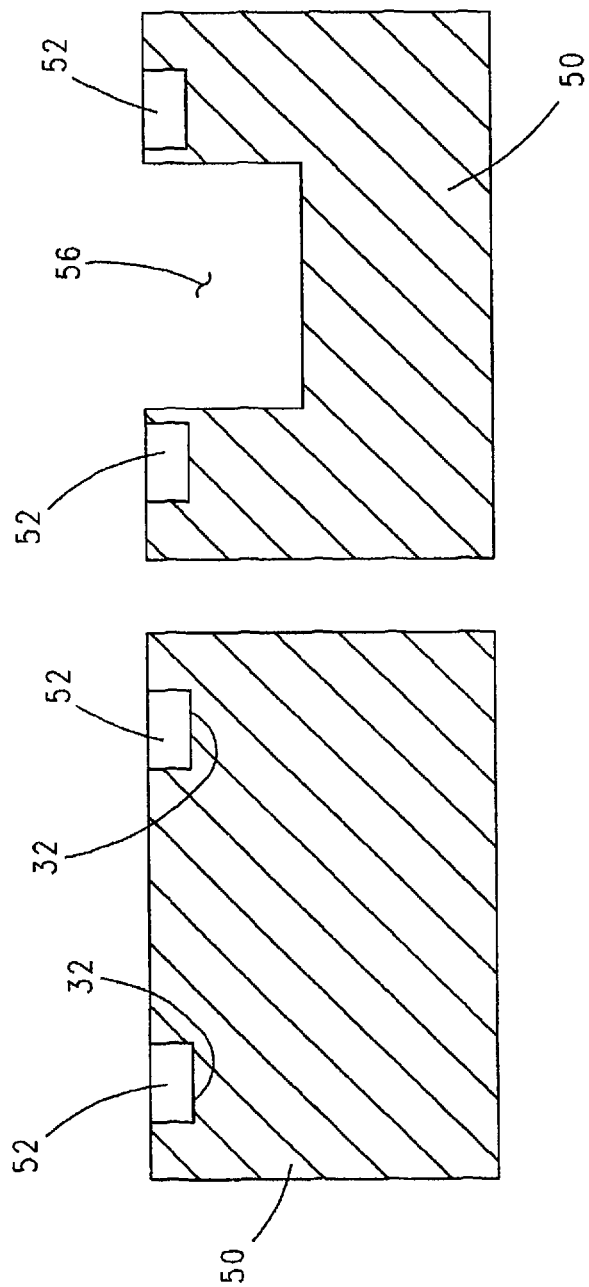

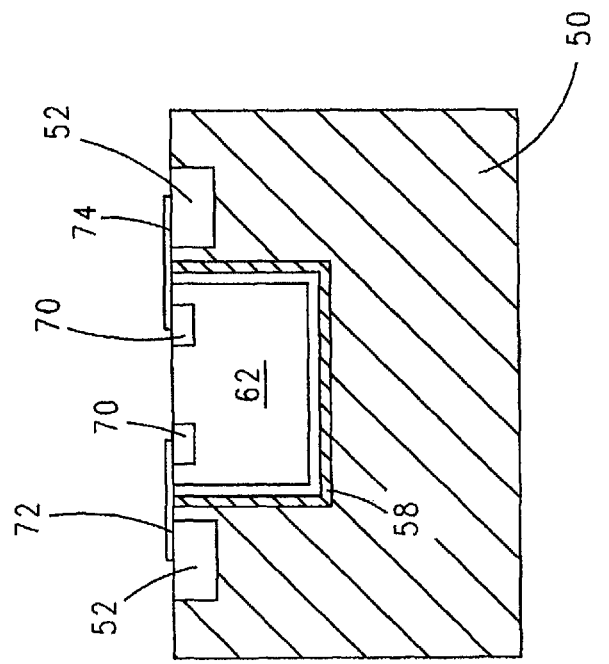
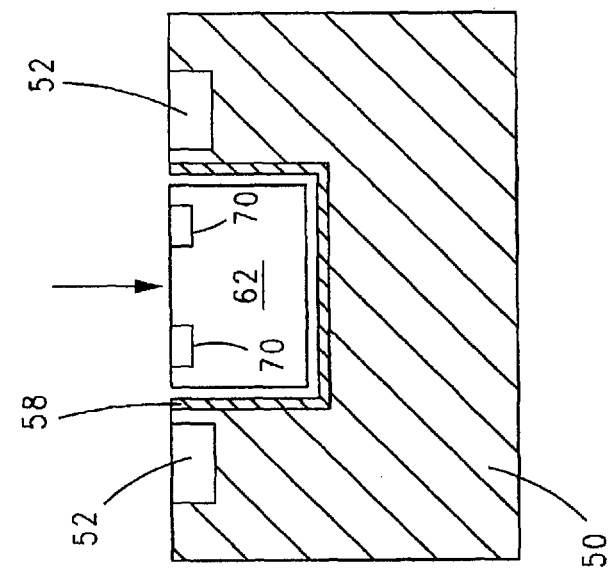

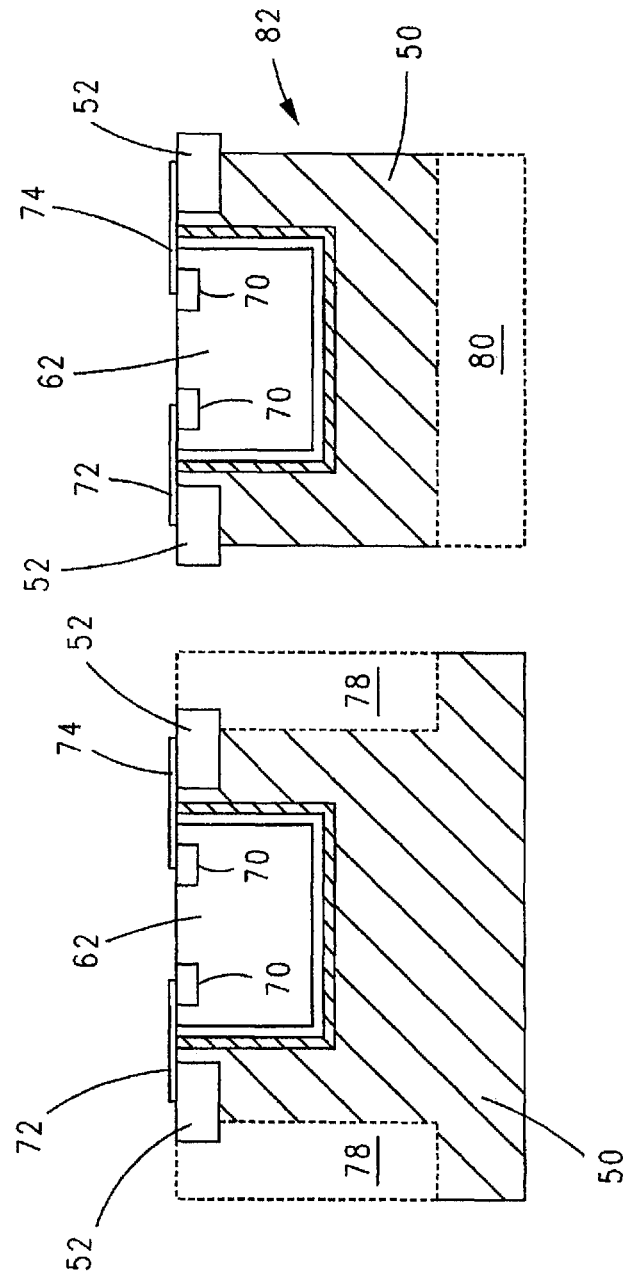

EXAMPLE 2
STEP 26

EXAMPLE 2
STEPS 6 AND 24

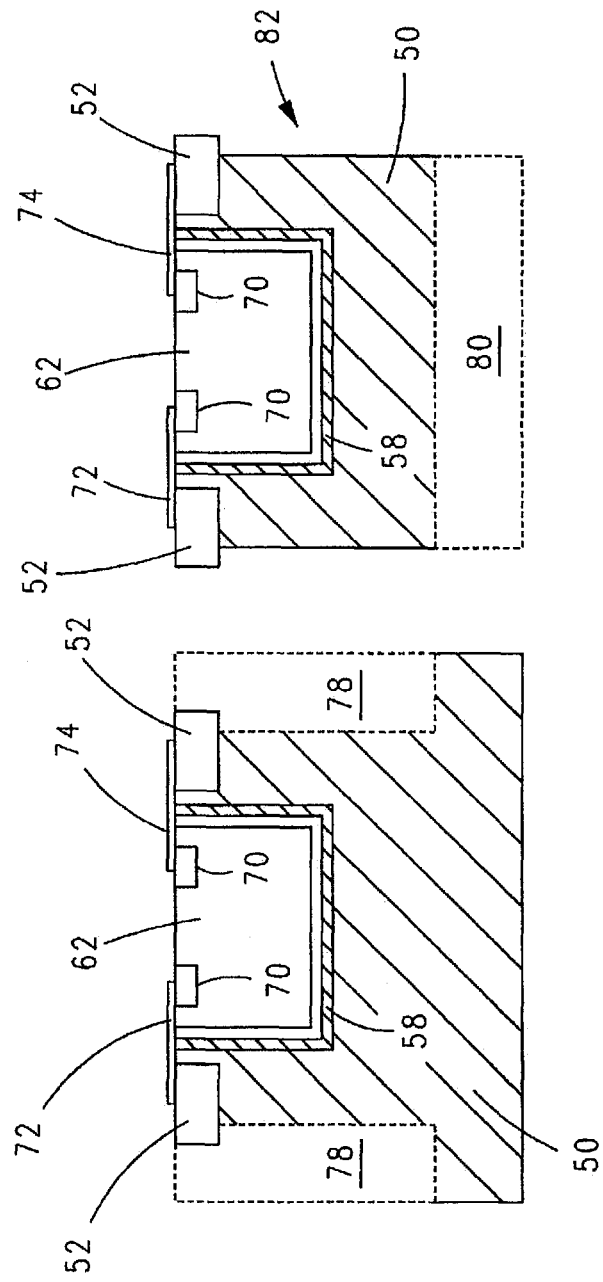

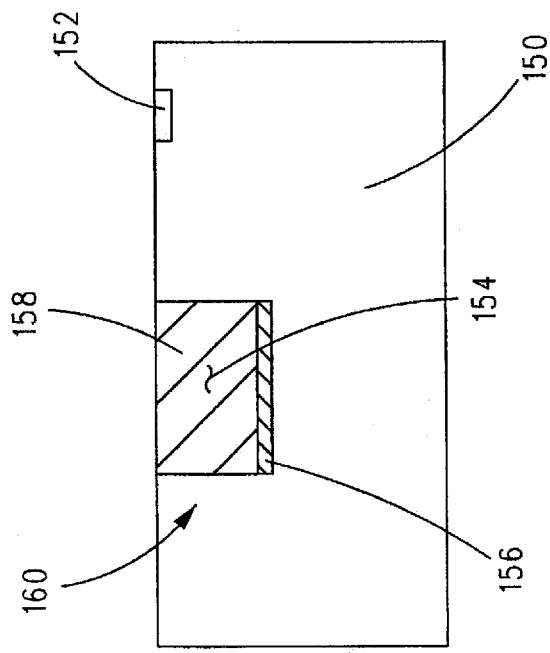
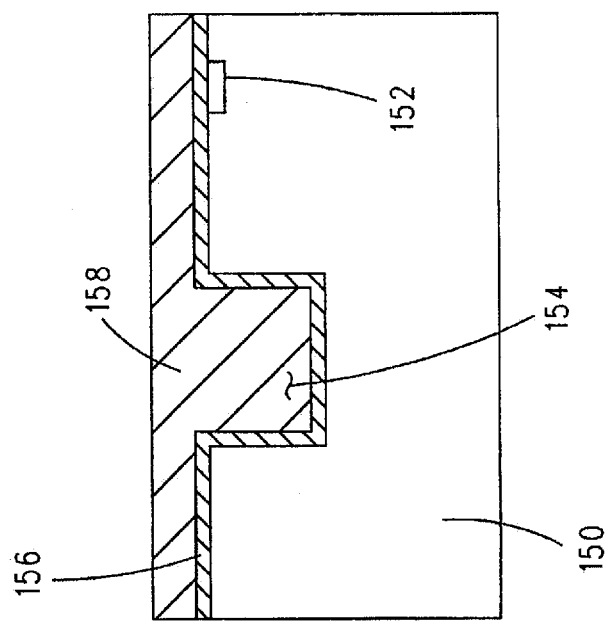

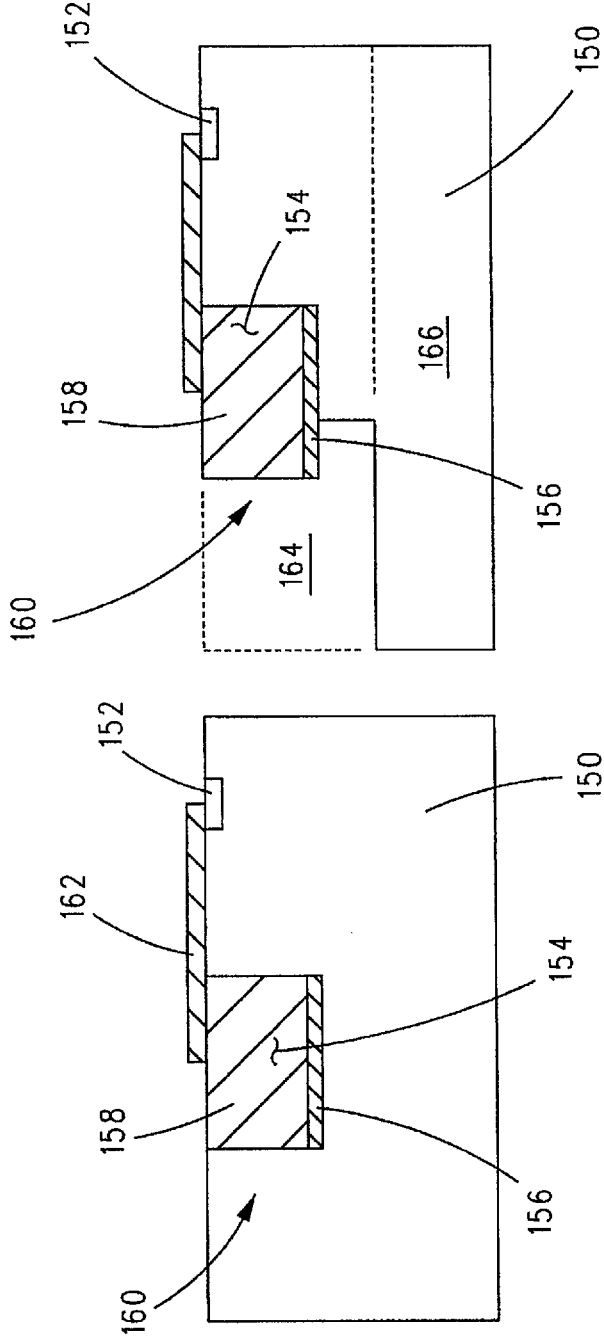

PROTOTYPING OF ELECTRONIC CIRCUITS WITH EDGE INTERCONNECTS

CROSS REFERENCE TO RELATED APPLICATIONS

This application claims the benefit of U.S. Provisional Patent Application Nos. 62/247,439; 62/247,457; and 62/247,477, all of which were filed on Oct. 28, 2015, and all of which are incorporated herein by reference in their entirety.

BACKGROUND OF THE INVENTION

Field of the Invention

The present invention relates to an assembly that includes electrical circuitry and projecting or protruding nodules and a method of forming the same.

Description of Related Art

System in package (SiP) is a combination of multiple electronic components of different functionality, assembled together to provide multiple functions associated with the system or sub-system. A SiP component may be an active integrated circuit dye, passive components, MEMS devices, optical components as well as other packaging and devices.

Quilt packaging (QP) is a SiP chip-to-chip interconnect technology which utilizes "nodules" that extend from, project, or protrude out from vertical facets along edges of substrates, such as integrated circuit chips or PCBs, to allow for inter-substrate communication and mechanical fastening and alignment. QP technology enables the interconnection of multiple substrates fabricated with dissimilar technologies or substrate materials to be integrated into a monolithic-like structure.

Due to the nature of the QP manufacturing process, the geometry of the nodules and chips/component substrate are lithographically-defined, which allows for the application/specific definition of the substrate-to-substrate gap and alignment, in addition to overall package-level system architecture. QP is a complementary packaging approach to existing SiP technologies, such as 3-D chip stacking and flip chip. Details regarding quilt packaging and the formation of nodules can be found in U.S. Pat. No. 7,612,443 to Bernstein et al. which is incorporated herein by reference in its entirety.

Disclosed herein is a method of rapid prototyping and manufacture of QP interposers (or nodules) for existing active and passive chips, components, or substrates. Also disclosed is the application of QP technology on non-semiconducting materials, as well as the application of QP technology to reduce or eliminate small signal or switching noise between chips or components.

SUMMARY OF THE INVENTION

Various preferred and non-limiting examples or aspects of the present invention will now be described and set forth in the following numbered clauses.

Clause 1. A method of forming an assembly including a microchip and interconnect nodules comprises: (a) forming a first, microchip receiving cavity in a surface of a substrate formed of a substrate material; (b) forming a plurality of second, nodule cavities in the surface of the substrate (along at least one edge of the first cavity) proximate to the microchip receiving cavity; (c) following step (a), inserting a microchip in the first cavity (top surface of microchip planar with the surface of the substrate), with a top surface of the microchip facing outward from the first cavity having an electrical circuit formed thereon; (d) following step (b), depositing electrically conductive material in each second cavity thereby forming a conductive pad in said second cavity (top surface of the electrically conductive material in each nodule cavity planar with the surface of the substrate), with a top surface of each conductive pad facing outward from the second cavity; (e) following steps (a)-(d), forming conductive traces on the top surface of the microchip, wherein each conductive trace connects at least one conductive pad to at least one element of the electrical circuit; and (f) removing portions of the substrate material to form from the substrate material a carrier that supports the conductive pads proximate to the microchip with a portion of each conductive pad projecting or protruding from the carrier.

Clause 2. The method of clause 1, further including: performing steps (a) and (b) in any order; and performing steps (c) and (d) in any order.

Clause 3. The method of clause 1 or 2, further including, before step (c), depositing in the first cavity a passivation layer, an adhesion layer, or both.

Clause 4. The method of any of clauses 1-3, wherein the substrate can be a semiconductor wafer.

Clause 5. The method of any of clauses 1-4, wherein the semiconductor wafer can be comprised of at least one of the following: silicon, germanium, and gallium.

Clause 6. The method of any of clauses 1-5, wherein each cavity can be formed by wet or dry etching the surface of the substrate via a patterned sacrificial layer formed on the surface of the substrate.

Clause 7. The method of any of clauses 1-6, wherein the conductive traces can be formed by selectively removing portions of a conductive layer deposited on the surfaces of the microchip, the conductive pads, and the substrate.

Clause 8. The method of any of clauses 1-7, wherein each second cavity can be spaced from the first cavity.

Clause 9. The method of any of clauses 1-8, wherein the surface of the substrate, the top surface of the microchip, and the top surface of each conductive pad can be in the same plane.

Clause 10. The method of any of clauses 1-9, wherein the element of the electrical circuit can be one of the following: an electrical conductor; a node or terminal of an active device; or a node or terminal of a passive device.

Clause 11. The method of any of clauses 1-10, wherein: the active device can be one of the following; a transistor or a diode; and the passive device is one of the following: a capacitor, an inductor or a resistor.

Clause 12. The method of any of clauses 1-11, wherein the portion of each conductive pad projecting or protruding from the carrier is free of the substrate material on all sides and end of said portion of the conductive pad.

Clause 13. An assembly including a microchip and interconnect nodules comprising: a carrier; a microchip in a first cavity in a surface of the carrier; a conductive pad in a second cavity in the surface of the carrier proximate to the first cavity, the conductive pad having: a first part spaced from an edge of the microchip, a second part proximate to the edge of the microchip between the first part and the edge of the microchip, and a body between the first and second parts; and at least one conductor connected between the conductive pad and a circuit element of the microchip, wherein the first part of the conductive pad and a part of the body of the conductive pad proximate to the first part protrude from the carrier.

Clause 14. The assembly of clause 13, wherein the carrier can be comprised of at least one of the following: silicon, germanium, and gallium.

Clause 15. The assembly of clause 13 or 14, wherein the first and second cavities can be spaced from each other by a portion of the carrier.

Clause 16. The assembly of any of clauses 13-15, wherein the surface of the carrier, a top surface of the microchip, and a top surface of the conductive pad can be in the same plane.

Clause 17. The assembly of any of clauses 13-16, wherein the element of the electrical circuit can be one of the following: an electrical conductor; a node or terminal of an active device; or a node or terminal of a passive device.

Clause 18. A method of forming an assembly including a microchip and interconnect nodules comprising: (a) photolithographically forming first and second cavities having different depths in a surface of a substrate formed of substrate material, wherein a depth of the first cavity is at least twice that of the second cavity; (b) depositing a microchip in the first cavity; (c) depositing conductive material in the second cavity thereby forming a conductive pad; (d) photolithographically forming a conductor between the conductive pad and a location on the microchip; (e) removing a portion of the substrate material to form a carrier that supports the conductive pad and microchip with a portion of the conductive pad projecting from the carrier.

Clause 19. The method of clause 18, wherein the conductive pad can be proximate the microchip.

Clause 20. A method of forming an assembly including projecting or protruding nodules comprises: (a) providing a substrate supporting an electrical circuit; (b) forming one or more cavities in the substrate; (c) forming a conductive pad in each cavity; (d) forming one or more conductive traces on the substrate, wherein each conductive trace connects a conductive pad to a location, node, or terminal of the electrical circuit; and (e) removing a part of the substrate to form an assembly that includes the electrical circuit, the one or more conductive traces, and a portion of each conductive pad projecting or protruding from the substrate.

Clause 21. The method of clause 20, wherein the electrical circuit can be: formed on the substrate; or formed on a microchip that is supported by the substrate.

Clause 22. The method of clause 20 or 21, wherein the microchip can be received in a cavity of the substrate.

Clause 23. The method of any of clauses 20-22, wherein the substrate can be a printed circuit board.

Clause 24. The method of any of clauses 20-22, wherein the substrate can be semiconductor material.

BRIEF DESCRIPTION OF THE DRAWINGS

FIGS. 2-4 are plan views of a substrate, for example, a semiconductor wafer, and a method of forming one or more assemblies including projecting or protruding nodules in accordance with Example 1, including steps 6-14 in the flow diagram of FIG. 1;

FIGS. 6 and 7 are plan views of the substrate of FIGS. 2-4 and a method of forming one or more assemblies including projecting or protruding nodules in accordance with Example 1, steps 16-20 in the flow diagram of FIG. 1;

FIG. 8 is a plan view of singulated assemblies including projecting or protruding nodules in accordance with Example 1, step 20 in the flow diagram of FIG. 1;

FIGS. 9-14 are cross-sectional views of the method of forming assemblies including projecting or protruding nodules in accordance with Example 1, steps 6-20 in the flow diagram of FIG. 1;

FIGS. 21-26 are cross-sectional views of the method of forming assemblies including projecting or protruding nodules in accordance with Example 2, steps 6, 24-30, 18, and 20 in the flow diagram of FIG. 1;

FIGS. 28-35 are cross-sectional views of a method of forming the assembly including projecting or protruding nodules in accordance with Example 3 shown in the flow diagram of FIG. 27.

DESCRIPTION OF THE INVENTION

The following examples will be described with reference to the accompanying figures where like reference numbers correspond to like or functionally equivalent elements.

Figure 1:
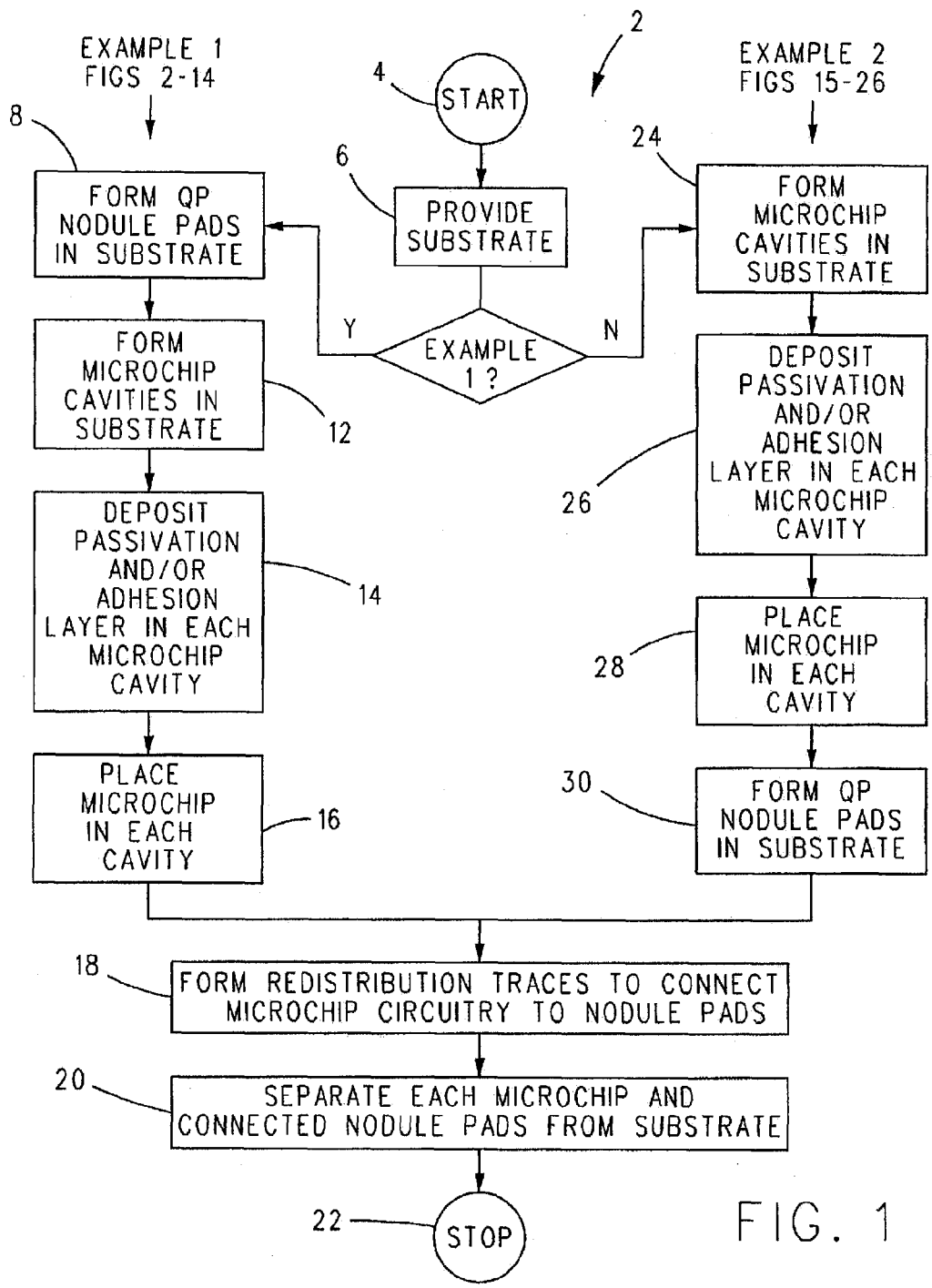
FIG. 1 is a flow diagram of the steps of a method of forming an assembly including projecting or protruding nodules in accordance with an Example 1 and an Example 2.

With reference to FIG. 1, a flow chart 2 of first and second example methods (Example 1 and Example 2) of forming an assembly including a microchip and interconnect nodules is shown. Both example methods initially advance from a start step 4 to a step 6 wherein a substrate 50 (FIG. 2) is provided. In an example, substrate 50 can be a semiconductor wafer and/or can be comprised of silicon, germanium, or gallium. In another example, substrate 2 can be a printed circuit board made of any suitable and/or desirable material, including, without limitation, one or more of epoxy; polyester; woven and/or non-woven glass fiber-reinforced ceramics; ceramic filled, ceramic-temperature polymers; and the like. The description herein of substrate 50 being comprised of a specific material, however, is not to be construed as in a limiting sense since it is envisioned that any suitable and/or desirable substrate material now known or hereinafter developed can be utilized. For the purpose of describing the Example 1, it will be assumed that substrate 50 is a semiconductor wafer.

With reference to FIGS. 1, 2, and 9 in the first example (Example 1) of forming an assembly including a microchip and interconnect nodules, the method advances from step 6 to step 8 wherein QP nodule pads 52 (FIGS. 2 and 9) are formed in substrate 50 in a manner described, for example, in U.S. Pat. No. 7,612,443 which is incorporated herein by reference. Briefly, QP nodule pads 52 are formed in nodule cavities 32 (FIG. 9) that are etched into substrate 50 in a desired pattern. Once formed, the exposed surfaces of cavities 32 are passivated with an oxide layer and a resist coating is applied to substrate 50. Next, the resist coating is removed from above cavities 32 to form openings and a seed metal is then deposited into the trenches through the openings in the resist which is subsequently removed. Next, an electroless plating process is applied to the deposited seed metal to form QP nodule pads 52. If necessary, a polishing step, such as chemical mechanical polishing (CMP), can be performed on the QP module pads 52 to make them planar or substantially planar with a top surface of substrate 50. Herein, "QP nodule", "QP nodule pad", and "conductive pad" are used interchangeably.

In this Example 1 of forming an assembly including a microchip and interconnect nodules, the QP nodule pads 52 are formed into rectangular or square patterns 54 (FIG. 3) on substrate 50. In this example, each pattern 54 of QP nodule pads 52 is configured to receive a microchip 62 (described hereinafter) in a microchip cavity 56 proximate to the QP nodule pads 52 forming each pattern 54. In the various examples described herein, a limited number (four) of patterns 54 are shown on substrate 50. However, this is not to be construed in a limiting sense.

With reference to FIGS. 1, 3, and 10, the method then advances to step 12 wherein microchip cavities 56 are formed in substrate 50, with each cavity 56 formed proximate to the pattern 54 of QP nodule pads 52 to be associated with said cavity 56. In this example, each microchip cavity 56 is square or rectangular and has four QP nodule pads 52 positioned proximate to each edge of cavity 56. However, this is not to be construed in a limiting sense. Moreover, substrate 50 is shown as having four microchip cavities 56, with each cavity 56 having a pattern 54 of QP nodule pads proximate to said microchip cavity 56. However, this is not to be construed in a limiting sense.

Referring to FIGS. 1, 4, and 11, the method then advances to step 14 wherein a layer 58 comprising an adhesion layer and, optionally, a passivation layer is formed in each microchip cavity 56. In an example, the adhesion layer can be any suitable and/or desirable epoxy that is compatible with the material forming substrate 50 and the microchip 62 to be deposited in microchip cavity 56. If provided within microchip cavity 56, optional passivation layer (disposed between the adhesion layer and microchip 62) can isolate microchip 62 from the material forming substrate 50.

As shown in FIG. 11, layer 58 can be deposited on the base and sidewalls of microchip cavity 56. However, this is not to be construed in a limiting sense.

Referring to FIGS. 1, 5, 6, and 12, the method then advances to step 16 wherein a microchip 62 is placed in each cavity 56 that includes layer 58. Once microchips 62 are placed in microchip cavities 56, the adhesion part of layer 58 can be cured in any suitable and/or desirable manner to adhere (secure) microchips 62 within microchip cavities 56. In FIG. 12, a small gap is shown between microchip 62 and layer 58 for illustration purposes. In an example, however, microchip 62 and layer 58 can completely fill cavity 56, whereupon layer 58 can fill any space between microchip 62 and the walls of cavity 56.

Figure 5:
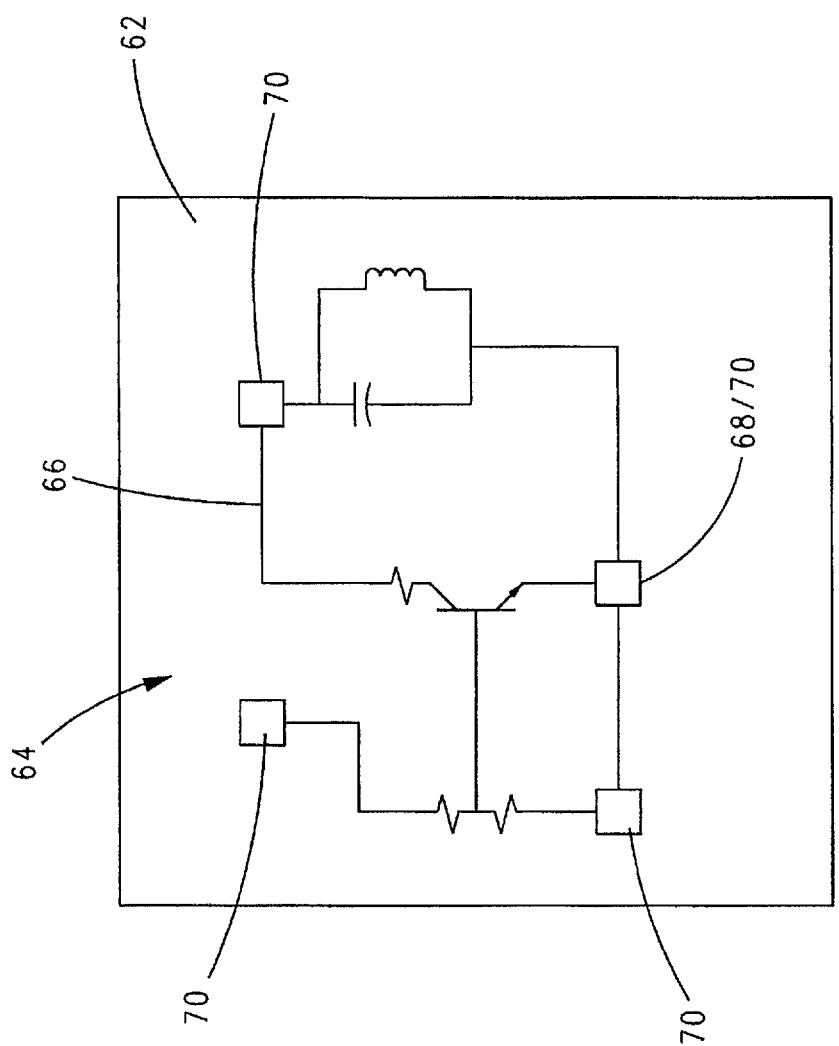
FIG. 5 is a plan view of a microchip including an example electrical circuit formed thereon.

FIG. 5 shows an example microchip 62 that includes a schematic example of an electrical circuit 64 that includes one or more electrical conductors 66, a terminal 68 of an active device, and terminals 70 of passive devices. Each active device can be, for example, a transistor and/or a diode, and each passive device can be a capacitor, an inductor, or a resistor. Moreover, a single electrical conductor or a single terminal can be connected to an active device and a passive device, e.g., terminal 68/70 in FIG. 5.

Referring to FIGS. 1, 6, and 12, once microchips 62 have been secured in cavities 56, the method then advances to step 18 wherein conductive traces 72, 74, and 76 can be formed on the top surface of each microchip 62. Each conductive trace 72-76 connects at least one QP nodule pad 52 to at least one element of electrical circuit 64. As noted above, each element can be an electrical conductor, a terminal of an active device, a terminal of a passive device, or some combination thereof. The conductive traces 72-76 for each microchip 62 can be formed in any suitable and/or desirable manner known in the art or hereinafter developed. In an example, conductive traces 72-76 are photolithographically formed in a manner known in the art from a sheet of conductive material deposited over one or more passivation layers formed on the top surfaces of substrate 50, QP nodule pads 52, and microchip 62. Thereafter, utilizing photolithographic pattern and etching processes well known in the art of semiconductive processing, conductive traces 72-76 can be formed between elements on each microchip 62 and QP nodule pads 52 proximate to said microchip 62.

FIG. 6 shows three conductive traces 72-76 coupled to three QP nodule pads 52, three terminals 70, and one terminal 68/70. However, this is not to be construed in a limiting sense.

Figures 7, 8:
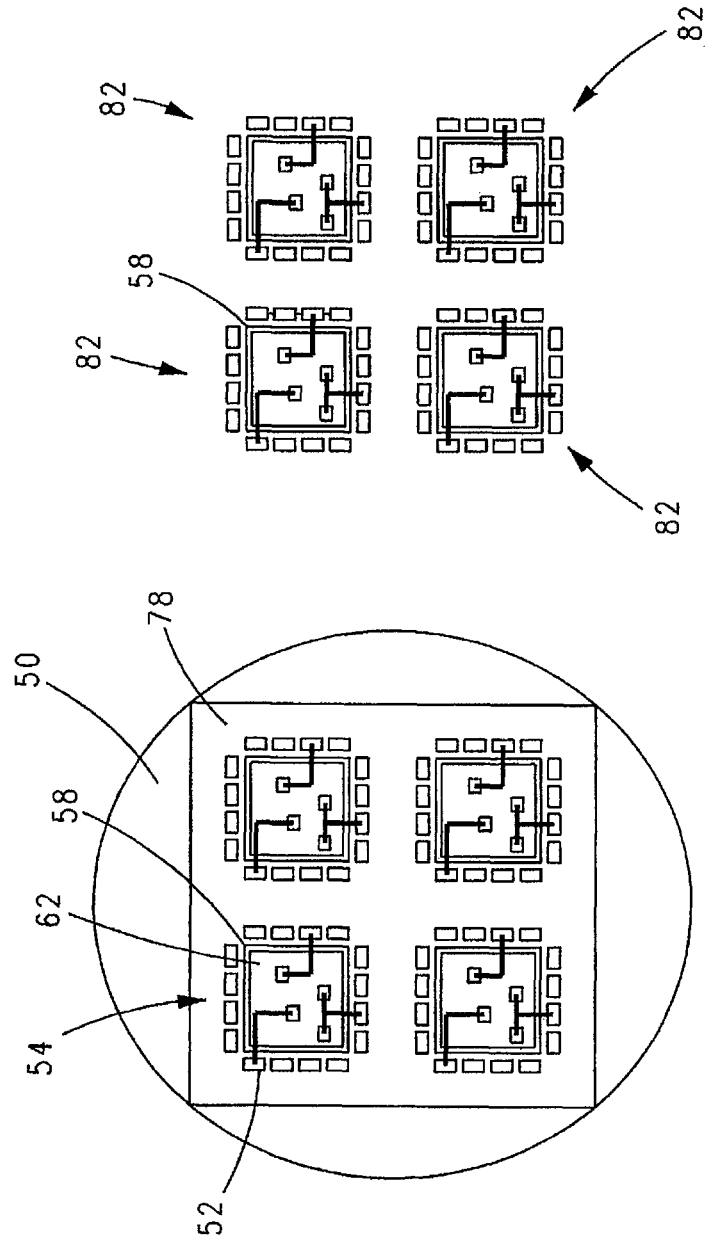

Referring to FIGS. 1, 7, and 13, the method then advances to step 20 wherein each microchip 62 and connected (proximate) QP nodule pads 52 are separated from substrate 50. Specifically, as shown in FIGS. 7 and 13, a dye separation etch can be utilized to remove substrate material 78 around each microchip 62 and related pattern 54 of QP nodule pads 52. More specifically, as best shown in FIG. 13, the dye separation etch can be controlled to remove substrate material 78 surrounding each pattern 54 of QP nodule pads 52 and at least partially below the body of each QP nodule pad 52 proximate to an outer face of said QP nodule pad 52.

In an example, assuming the dye separation etch used to remove substrate material 78 is stopped as shown in FIG. 13, whereupon a base portion of substrate 50 remains and holds microchips 62 and proximate patterns 54 of QP nodule pads 52 together, a backside grind step can be utilized to remove the material denoted by reference number 80 to form a number of singulated assemblies 82, each of which includes the remainder of the substrate after removing substrate materials 78 and 80, microchip 62 in cavity 56, QP nodule pads 52, and conductive traces 72-76 connecting conductors and/or terminals of electrical circuit 64 to QP nodule pads 52.

This completes the description of Example 1.

Figure 16:
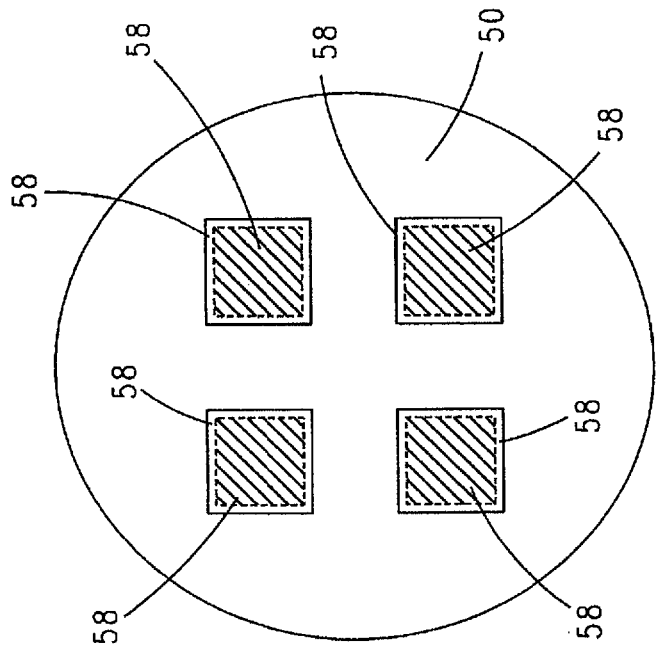
FIGS. 15-19 are plan views of a substrate, for example, a semiconductor wafer, and a method of forming one or more assemblies including projecting or protruding nodules in accordance with Example 2, steps 6, 24-30, 18, and 20 in the flow diagram of FIG. 1.
Figure 15:
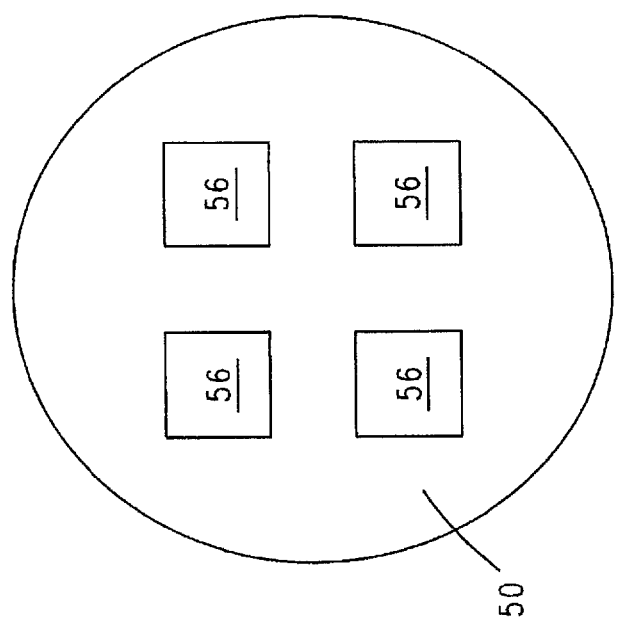
Figure 22:
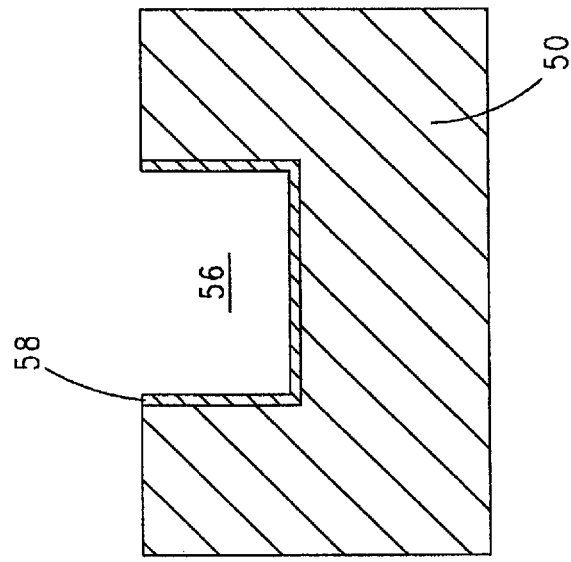
Figure 21:
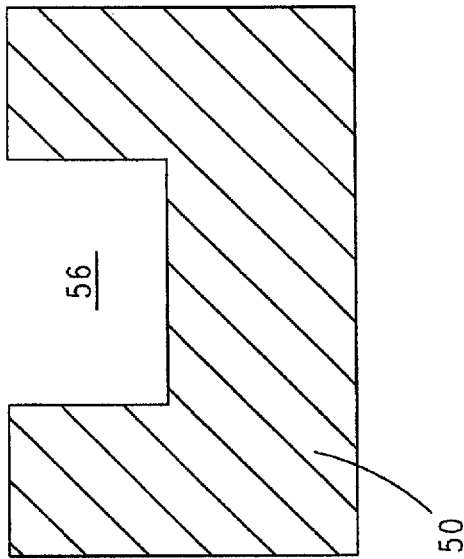

Having thus described a first example (Example 1) method of forming assembly 82, a second example (Example 2) of forming assembly 82 will now be described with ongoing reference to FIG. 1 and with reference to FIGS. 15-26. In Example 2, the method advances from start step 4 to step 6 (FIGS. 15 and 21) wherein substrate 50 is provided. Next, the method advances to step 24 (FIGS. 15 and 21) wherein microchip cavities 56 are formed in substrate 50. Referring to FIGS. 1, 16, and 22, next, a layer 58 can be formed or deposited in each cavity 56. Each layer 58 can comprise an adhesion layer and an optional passivation layer. In the case where layer 58 includes a passivation layer, such passivation layer can be grown or formed within each cavity 56 in a manner known in the art and the adhesion layer (a suitable adhesive) can be deposited on top of the passivation layer.

Figures 17, 18:
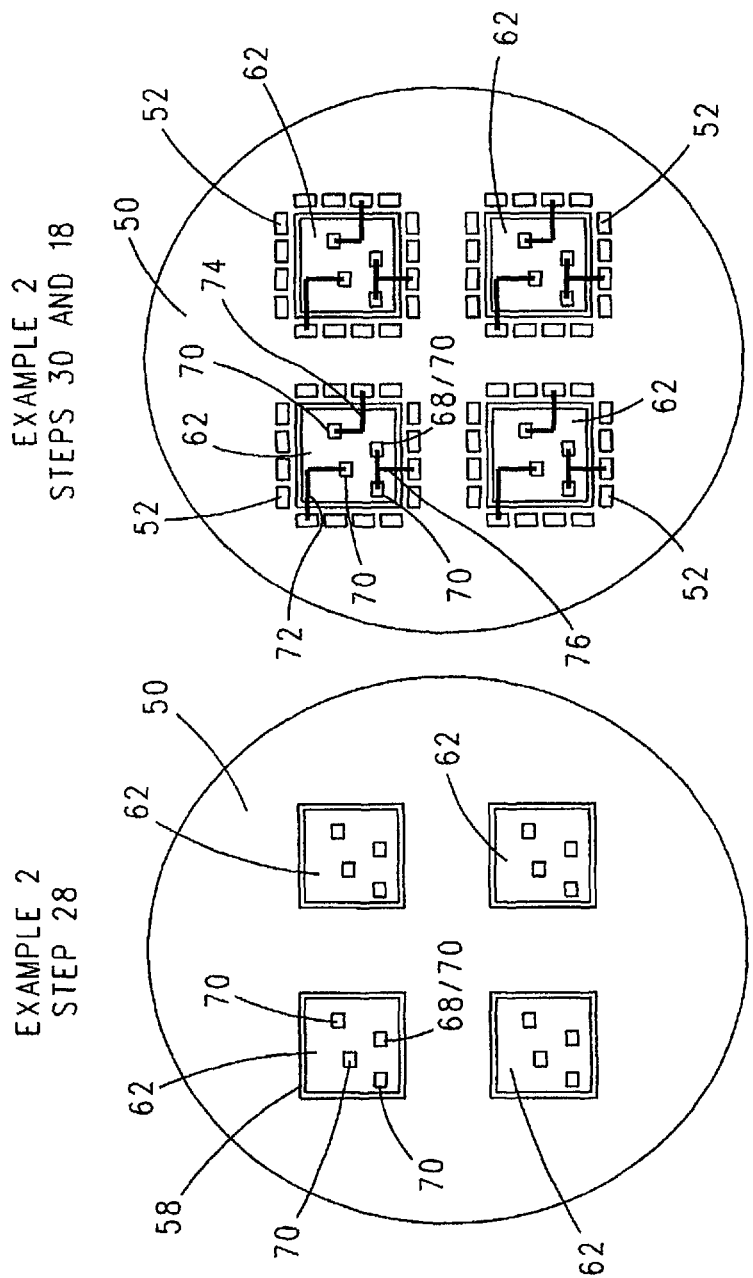
Figure 20:
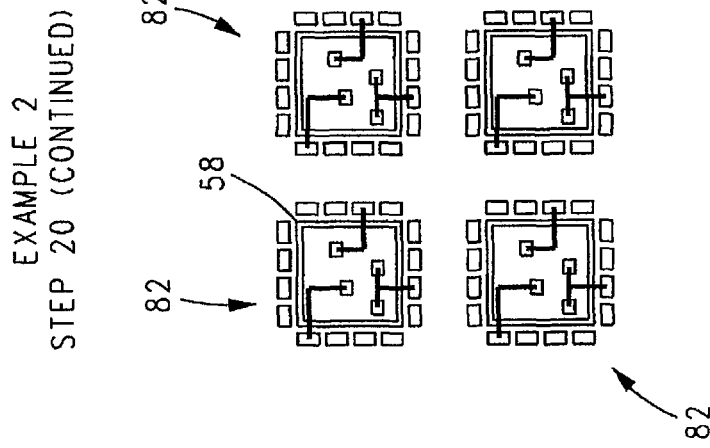
FIG. 20 is a plan view of singulated assemblies including projecting or protruding nodules made in accordance with Example 2, steps 6, 24-30, 18, and 20 in the flow diagram of FIG. 1.
Figures 23, 24:
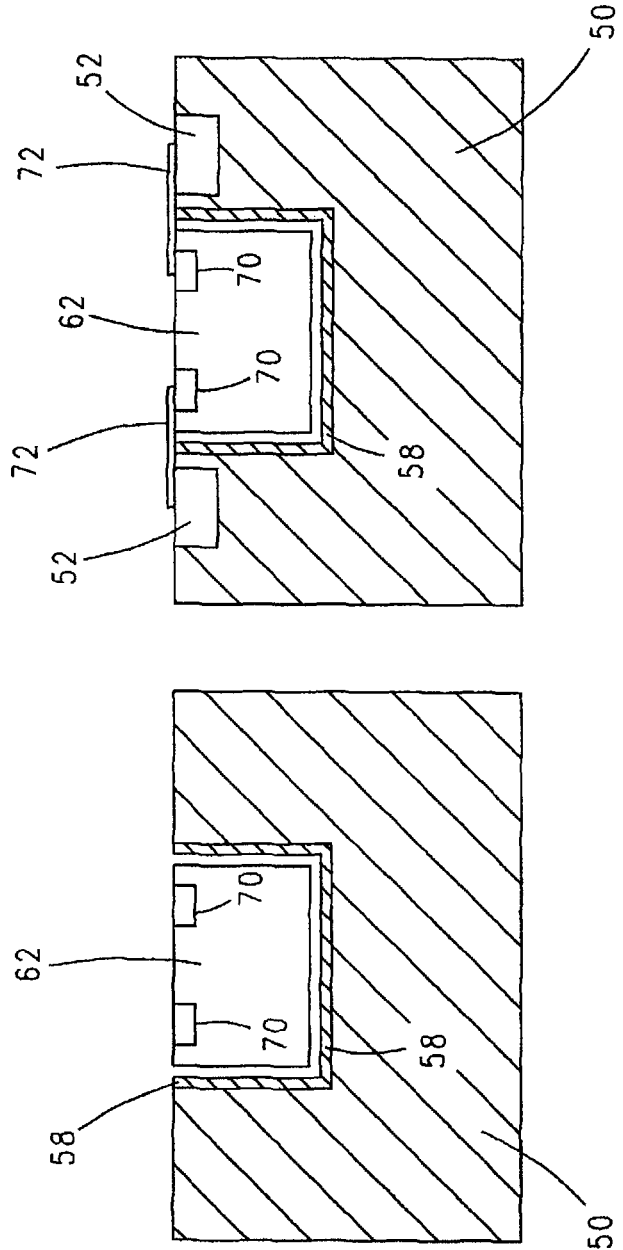

With reference to FIGS. 1, 17, and 23, the method then advances to step 28 wherein a microchip 62 is placed in each cavity 56. Thereafter, the adhesion part of layer 58 is cured.

With reference to FIGS. 1, 18, and 24, the method then advances to step 30 wherein QP nodule pads 52 are formed proximate to each microchip 62. In an example, each nodule pad 52 is formed in a cavity 32 formed in substrate 50 proximate to the corresponding microchip cavity 56 where microchip 62 is received. Each cavity 32 can be formed in any suitable and/or desirable manner, e.g., reactive ion etching. Once the cavity 32 for receiving the corresponding QP nodule pad 52 has been formed, conductive material is deposited in said cavity 32 to form QP nodule pad 52. In an example, this conductive material is a metal. QP nodule pads 52 in this example can be formed in the same manner as the QP nodules 52 described in Example 1.

With continuing reference to FIGS. 1, 18, and 24, the method then advances to step 18 wherein conductive traces 72-76 are formed in the manner discussed above in connection with Example 1 to one or more connect QP nodule pads 52 to a conductor 66, terminal 68, terminal 70, and/or terminal 68/70 of microchips 62.

Figure 19:
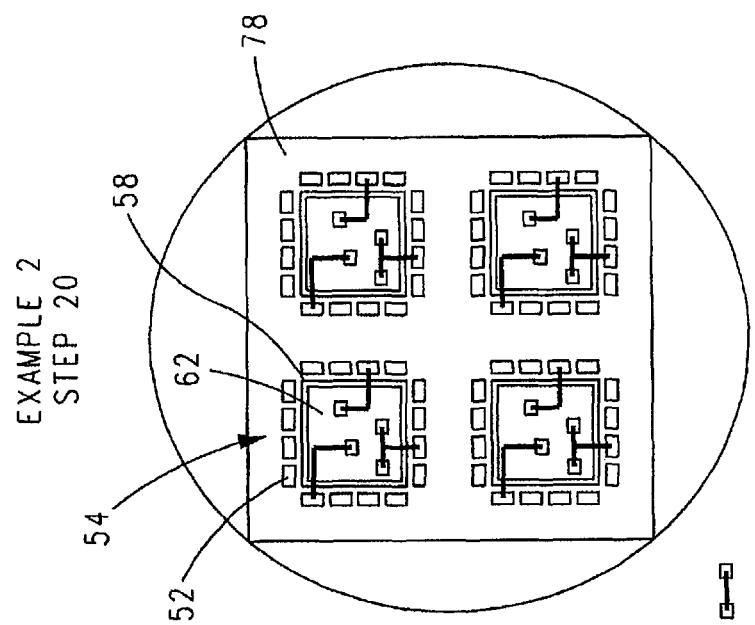

Referring to FIGS. 1, 19, and 25, next, a dye separation etch can be utilized to remove substrate material 78 and, optionally, substrate material 80 (FIG. 26). If the dye separation etch is only utilized to remove substrate material 78 then a back grind step can be utilized to remove substrate material 80 shown in FIG. 26 to produce a number of singulated assemblies 82, each including a microchip 62 and QP nodule pads 52.

This completes the description of Example 2.

A third example (Example 3) of forming an assembly that includes circuitry and interconnect nodules will now be described with reference to the flow diagram 102 of FIG. 27 and FIGS. 28-35.

Figure 27:
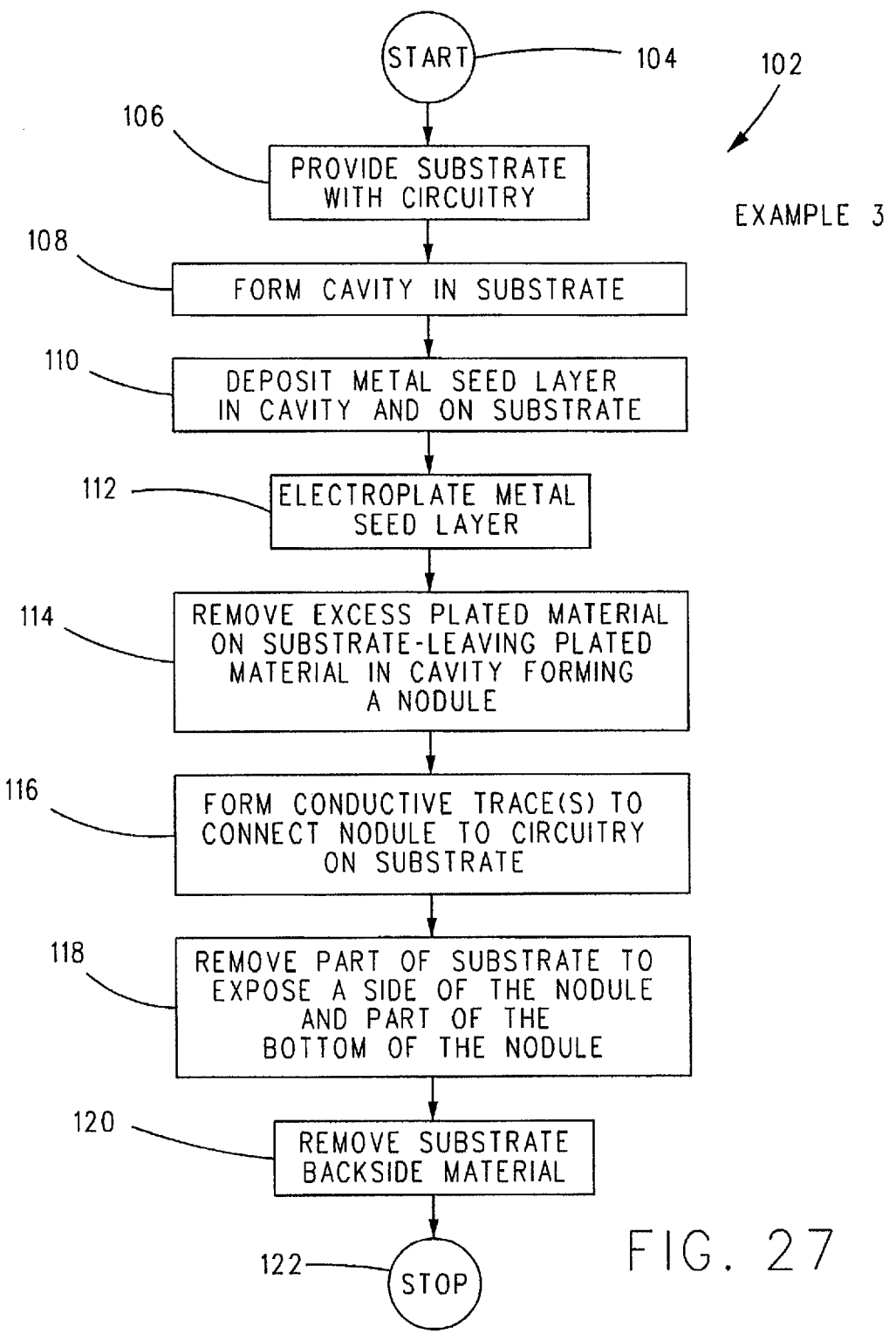
FIG. 27 is a flow diagram of a method of forming an assembly including projecting or protruding nodules in accordance with an Example 3.
Figure 28:
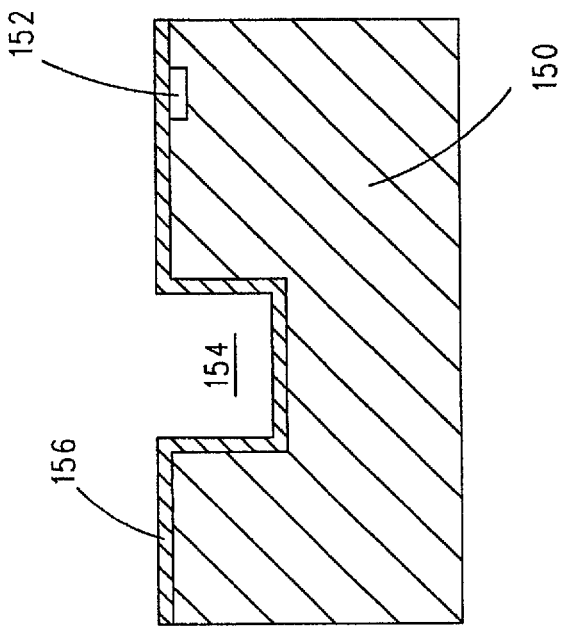

Referring to FIGS. 27 and 28, the method advances from start step 104 to step 106 wherein a substrate 150 including an electrical circuit 152 is provided. In this example, substrate 150 can be formed from semiconductor material or non-semiconductor material. In an example, the non-semiconductor material can be typical materials, known in the art, used to form printed circuit boards.

In FIGS. 28-35 the electrical circuit 152 is shown as a pad or contact in the surface of substrate 150. However, this is not to be construed in a limiting sense since it is envisioned that the electrical circuit represented by pad 150 can also or alternatively be deposited on and/or in the top surface of substrate 150.

Electrical circuit 152 can be any suitable and/or desirable circuit including, without limitation, a pattern of conductive tracks, pads, and/or other features formed on the top surface of substrate 150 which can be formed of an insulating material. Electrical circuit 152 can also or alternatively include components such as, without limitation, capacitors, resistors, or active devices adhered to and/or embedded in substrate 150. Substrate 150 can be single layer or multiple layers.

Figure 29:
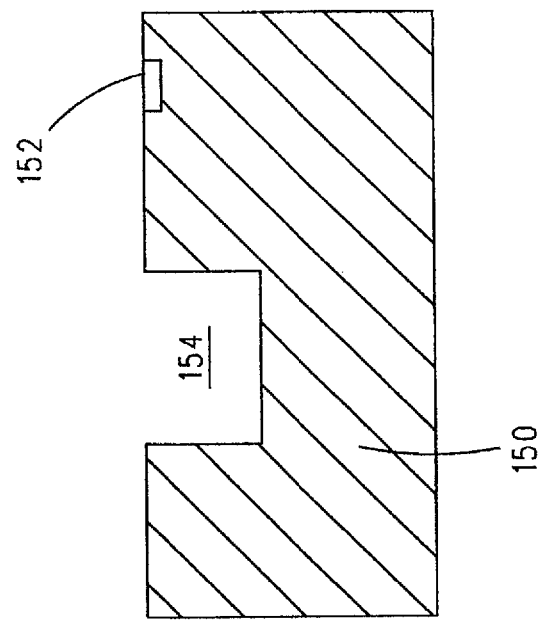

Referring to FIGS. 27, 28, and 29 the method then advances to step 108 wherein a cavity 154 is formed in substrate 150 via a material subtraction technique including, for example, dry etching, wet chemical etching, ion milling, laser etching, and micro drilling.

The method then advances to step 110 wherein a conductive (metal) seed layer 156 is deposited on the floor and side walls of cavity 154 and on the top surface of substrate 150. In an example, seed layer 156 is deposited via a chemical vapor deposition (CVD) process known in the art. However, this is not to be construed in a limiting sense since it is envisioned that any suitable and/or desirable means for depositing seed layer 156 can be utilized.

Referring to FIGS. 27 and 30, the method then advances to step 112 wherein seed layer 156 is electroplated with a conductive (metal) material 158. Conductive material 158 is electroplated on the exposed surfaces of seed layer 156 in the base and side walls of cavity 154 and on the top surface of substrate 150.

Referring to FIGS. 27 and 31, the method then advances to step 114 wherein excess plated material 158 is removed (in a manner known in the art) from substrate 150 leaving conductive material 158 in cavity 154 forming a QP nodule 160.

Referring to FIGS. 27 and 32, the method then advances to step 116 wherein one or more conductive traces 162 are formed on the top surface of substrate 150. Herein, conductive traces 162 are simply electrically conductive traces (e.g., formed from copper) that electrically connect two or more points. Each conductive trace 162 can be formed in any suitable and/or desirable manner, including, without limitation, silk screen printing, photo engraving, PCB milling, laser resist ablation, laser printing, and the like. The process of forming each conductive trace 162 can be additive, subtractive, or semi-additive. The process of forming each conductive trace 162 is well known in the art and will not be further described herein for simplicity.

Referring to FIGS. 27 and 33, the method then advances to step 118 wherein a portion 164 of the body and top surface of substrate 150 is removed to expose a side and a bottom part of a QP nodule pad 160 that includes conductive material 150 and seed layer 156. In an example, the portion 164 of substrate 150 that is removed does not include conductive trace(s) 162 and/or electrical circuit 152.

Figures 34, 35:
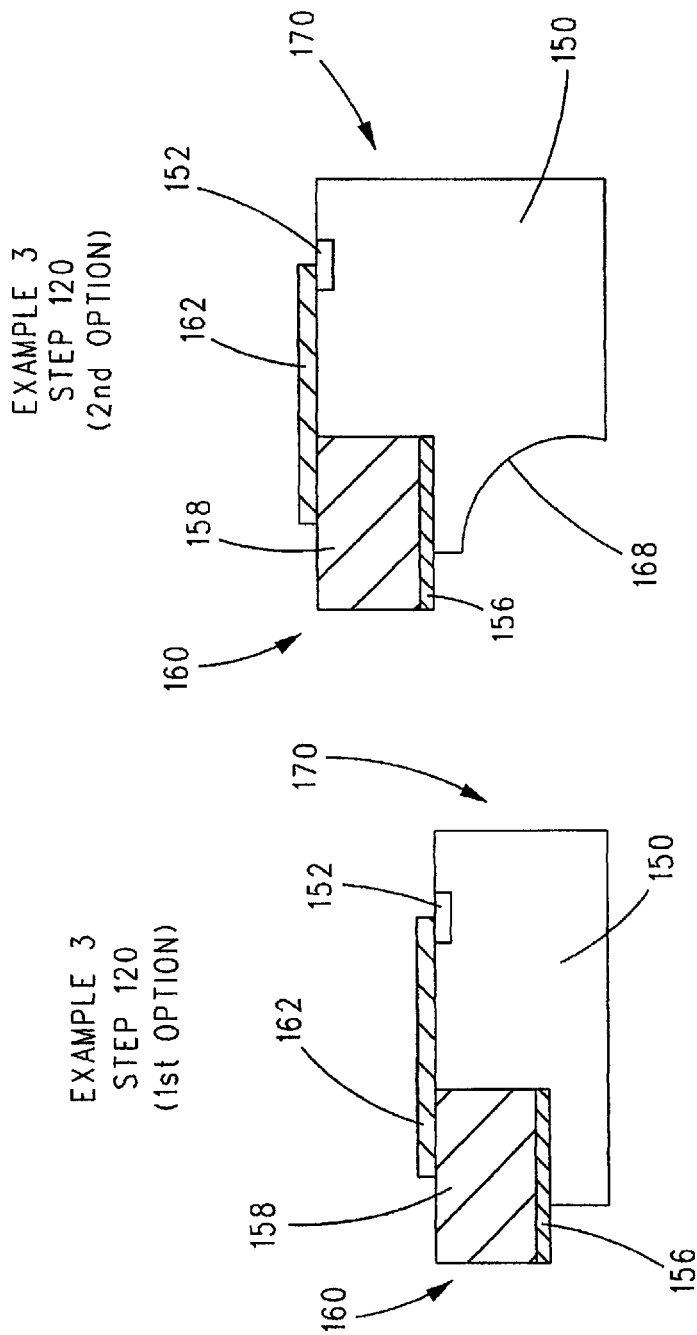

Referring to FIGS. 27, 33, and 34, the method then advances to step 120 wherein substrate backside material 166 (FIG. 33) can be removed via a grinding step to produce an assembly 170 (FIG. 34) that includes a portion of QP nodule pad 160 projecting from the remainder of substrate 150 that supports electrical circuit 152 and conductive trace 162 connected between electrical circuit 152 and QP nodule pad 160.

Alternatively, instead of removing portion 166 of substrate 150 via backside grinding, a subset of portion 166 can be removed via chemical etching to produce the assembly 170 shown in FIG. 35 having substrate 150 including a rounded edge 168 formed by the backside chemical etching process.

Finally, the method advances to stop step 122 wherein Example 3 is complete.

The third example (Example 3) described in connection with FIGS. 27-35 disclose the formation of an assembly 170 including a single QP nodule pads 160. However, this is not to be construed in a limiting sense since it is envisioned that assembly 170 can include a number of QP nodule pads 160 connected to electrical circuit 152 and, more particularly, in an example, to an element of electrical circuit 152 such as, without limitation, an electrical conductor; a node or terminal of an active device; and/or a node or terminal of a passive device.

Figure 36:
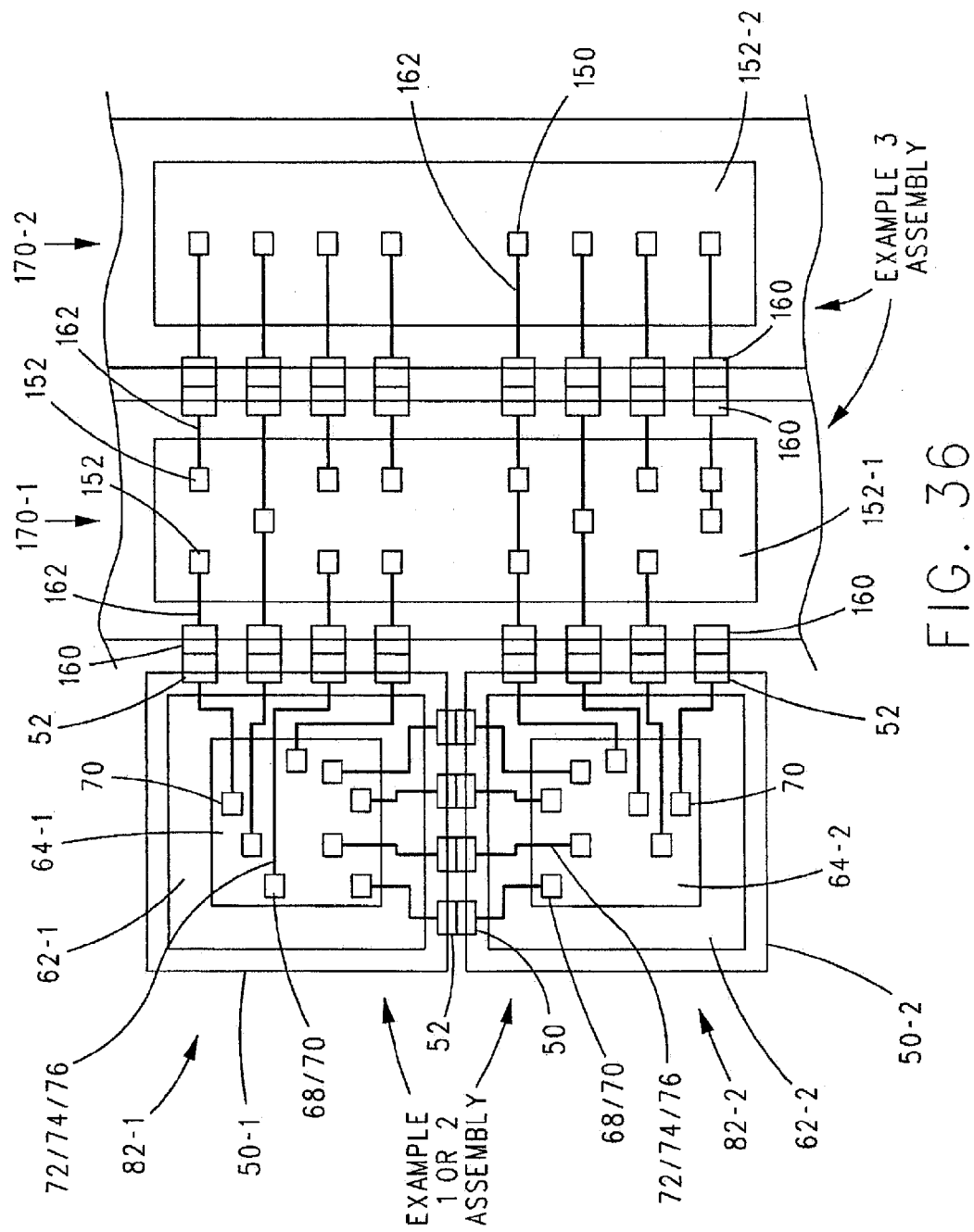
FIG. 36 is a pair of assemblies formed in accordance with Example 1 or Example 2 coupled together and coupled to an assembly made in accordance with Example 3, wherein the latter assembly is coupled to another assembly made in accordance with Example 3.

Referring now to FIG. 36, one or more assemblies 82 and/or one or more assemblies 170 can be coupled together via QP nodule pads in any suitable and/or desirable manner. In an example, an assembly 82-1 including an electrical circuit 64-1 for performing one function can be coupled to an assembly 82-2 including a second electrical circuit 64-2 designed to perform a different function via QP nodules or QP module pads 52. Assembly 82-1 can be made in accordance with Example 1 or 2 above. Assembly 82-2 can be made in accordance with Example 1 or 2.

In an example, circuit 64-1 can be a microprocessor and circuit 64-2 can be a display driver. However, this is not to be construed in a limiting sense since it is envisioned that each of circuits 64-1 and 64-2 can be any type of circuit deemed suitable and/or desirable by one of ordinary skill in the art desired to be coupled together via QP nodules 52.

An assembly 170-1, made in accordance with Example 3 above, can be connected to one or more assemblies 82 formed in accordance with Example 1 or Example 2 above via end-to-end contact of QP nodules or QP module pads 160 of assembly 170-1 and QP nodules 52 of one or more assemblies 82. Similarly, assembly 170-1 can be electrically coupled to another assembly 170-2 via end-to-end contact of QP nodules 160 of each assembly 170-1 and 170-2.

Assembly 170-1 can include electrical circuit 152-1 while assembly 170-2 can include electrical circuit 152-2. Electrical circuits 152-1 and 152-2 can be any suitable and/or desirable circuits that would benefit by being electrically connected via the distal ends of QP nodules 160 of assemblies 170-1 and 170-2.

As can be seen, disclosed herein is a method of forming an assembly including projecting or protruding nodules. In the method, a first, microchip receiving cavity is formed in a surface of a substrate formed of a substrate material. A plurality of second, nodule cavities or trenches is formed in the surface of the substrate (along at least one edge of the first cavity) proximate to the first receiving cavity. A microchip is inserted in the first cavity (with a top surface of the microchip desirably planar with a surface of the substrate), with a top surface of the microchip facing outward from the first cavity having an electrical circuit formed thereon. Electrically conductive material is deposited in each second cavity forming a conductive pad in said second cavity. Desirably, a top surface of the electrically conductive material in each second cavity is planar with the top surface of the substrate. Conductive traces are formed on the top surface of the microchip, with each conductive trace connecting at least one conductive pad to at least one element of the electrical circuit. Finally, portions of the substrate material are removed from the substrate material to form a carrier that supports the conductive pads proximate to the microchip with a portion of each conductive pad projecting or protruding from the carrier.

The steps of forming the first and second receiving cavities can be performed in any order. The steps of inserting the microchip in the first cavity and depositing electrically conductive material in the second cavity can also be performed in any order.

Before inserting the microchip in the first cavity, a passivation layer, an adhesion layer, or both, can be deposited in the first cavity.

The substrate can be a semiconductor wafer. Each cavity can be formed by wet or dry etching the surface of the substrate via a patterned sacrificial layer formed on the surface of the substrate. The conductive traces can be formed by selectively removing portions of a conductive layer deposited on the surface of the microchips, the conductive pads, and the substrate.

The element of the electrical circuit can be an electrical conductor, a node or terminal of an active device, or a node or terminal of a passive device.

The portion of each conductive pad projecting or protruding from the carrier can be free of the substrate material on all sides and end of said portion of the conductive pad.

Also disclosed is an assembly comprising a carrier having a microchip in a first cavity in a surface of the carrier and a conductive pad in a second cavity in the surface of the carrier proximate to the first cavity. The conductive pad has a first part spaced from an edge of the microchip, a second part proximate to the edge of the microchip between the first part and the edge of the microchip, and a body between the first and second parts. At least one conductor is connected between the conductive pad and a circuit element of the microchip. The first part of the conductive pad and a part of the body of the conductive pad proximate to the first part project or protrude from the carrier.

The carrier can be formed from silicon, germanium, or gallium. The first and second cavities can be spaced from each other by a portion of the carrier. The element of the electrical circuit can be an electrical conductor, a node or terminal of an active device, or a node or terminal of a passive device.

Also disclosed herein is a method of forming an assembly including projecting or protruding nodules comprising: photolithographically forming first and second cavities having different depths in the surface of the substrate formed of substrate material, wherein a depth of the first cavity is at least twice that of the second cavity. The photolithographically forming of the first and second cavities can be by way of wet or dry etching the surface of the substrate via a patterned sacrificial layer formed on the surface of the substrate. The sacrificial layer can be a patterned photoresist.

A microchip can be deposited in the first cavity and a conductive material can be deposited in a second cavity thereby forming a conductive pad. Next, a conductor is photolithographically formed between the conductive pad and a location on the microchip. The step of photolithographically forming the conductor can include wet or dry etching a surface of a conductive layer, such as copper, deposited on the substrate. The wet or dry etching of the conductive layer can be via a patterned sacrificial layer formed on the surface of the conductive layer. The sacrificial layer can be patterned photoresist that is patterned in a manner known in the art.

Finally, a portion of the substrate material is removed to form a carrier that supports the conductive pad and microchip with a portion of the conductive pad projecting or protruding from the carrier. In an example, the conductive pad can be proximate to the microchip.

Finally, disclosed herein is a method of forming an assembly including projecting or protruding nodules. The method comprises: providing a substrate supporting an electrical circuit and forming one or more cavities in the substrate. A conductive pad is formed in each cavity and one or more conductive traces are formed on the substrate, wherein each conductive trace connects a conductive pad to a location, node, or terminal of the electrical circuit. Part of the substrate is then removed to form an assembly that includes the electrical circuit, the one or more conductive traces, and a portion of each conductive path projecting or protruding from the substrate.

The electrical circuit can be formed on the substrate or can be formed on a microchip that is supported by the substrate. The microchip can be received in a cavity of the substrate.

The substrate can be a printed circuit board or can be formed of semiconductor material.

The examples have been described with reference to the accompanying figures. Modifications and alterations will occur to others upon reading and understanding the foregoing examples. Accordingly, the foregoing examples are not to be construed as limiting the disclosure.

The invention claimed is:

1. A method of forming an assembly including projecting or protruding nodules, the method comprising:

(a) forming a first, microchip receiving cavity in a surface of a substrate formed of a substrate material;
(b) forming a plurality of second, nodule cavities in the surface of the substrate proximate to the first receiving cavity;
(c) following step (a), inserting a microchip in the first cavity, with a top surface of the microchip facing outward from the first cavity having an electrical circuit formed thereon;
(d) following step (b), depositing electrically conductive material in each second cavity thereby forming a conductive pad in said second cavity, with a top surface of each conductive pad facing outward from the second cavity;
(e) following steps (a)-(d), forming conductive traces on the top surface of the microchip, wherein each conductive trace connects at least one conductive pad to at least one element of the electrical circuit; and
(f) removing portions of the substrate material to form from the substrate material a carrier that supports the conductive pads proximate to the microchip with a portion of each conductive pad projecting or protruding from the carrier.

2. The method of claim 1, further including:
performing steps (a) and (b) in any order; and
performing steps (c) and (d) in any order.

3. The method of claim 1, further including, before step (c), depositing in the first cavity a passivation layer, an adhesion layer, or both.

4. The method of claim 1, wherein the substrate is a semiconductor wafer.

5. The method of claim 1, wherein each cavity is formed by wet or dry etching the surface of the substrate via a patterned sacrificial layer formed on the surface of the substrate.

6. The method of claim 1, wherein the conductive traces are formed by selectively removing portions of a conductive layer deposited on the surfaces of the microchip, the conductive pads, and the substrate.

7. The method of claim 1, wherein each second cavity is spaced from the first cavity.

8. The method of claim 1, wherein the element of the electrical circuit is one of the following: an electrical conductor; a node or terminal of an active device; or a node or terminal of a passive device.

9. The method of claim 1, wherein the portion of each conductive pad projecting or protruding from the carrier is free of the substrate material on all sides and end of said portion of the conductive pad.

10. An assembly comprising:
a carrier;
a microchip in a first cavity in a surface of the carrier;
a conductive pad in a second cavity in the surface of the carrier proximate to the first cavity, the conductive pad having:
 a first part spaced from an edge of the microchip,
 a second part proximate to the edge of the microchip between the first part and the edge of the microchip, and
 a body between the first and second parts;
and
at least one conductor connected between the conductive pad and a circuit element of the microchip, wherein the first part of the conductive pad and a part of the body of the conductive pad proximate to the first part project or protrude from the carrier.

11. The assembly of claim 10, wherein the carrier is comprised of at least one of the following: silicon, germanium, and gallium.

12. The assembly of claim 10, wherein the first and second cavities are spaced from each other by a portion of the carrier.

13. The assembly of claim 10, wherein the element of the electrical circuit is one of the following: an electrical conductor; a node or terminal of an active device; or a node or terminal of a passive device.

* * * * *